United States Patent [19]

Platts et al.

[11] 3,997,727
[45] Dec. 14, 1976

[54] TIME DIVISION MULTIPLEXED DIGITAL SWITCHING APPARATUS

[75] Inventors: John Charles Platts, Doncaster; Trevor Ross Geisler, Melbourne; Keith Harwood, Brunswick; Christopher Gerald Sheahan, Glenroy, all of Australia

[73] Assignee: L M Ericsson Pty. Ltd., Australia

[22] Filed: Nov. 13, 1973

[21] Appl. No.: 415,424

[30] Foreign Application Priority Data

Nov. 13, 1972 Australia .................... 1198/72

[52] U.S. Cl. .................. 179/15 AQ; 179/15 A
[51] Int. Cl.² ................................ H04J 3/00
[58] Field of Search ........ 179/15 AQ, 15 AT, 15 A, 179/15 BS, 15 BY, 18 F, 18 FG

[56] References Cited
UNITED STATES PATENTS

| | | | |
|---|---|---|---|
| 3,073,907 | 1/1963 | Alterman | 179/18 FG |
| 3,111,560 | 11/1963 | Gatzert | 179/18 F |
| 3,603,737 | 9/1971 | LeDorh | 179/15 BY |
| 3,632,883 | 1/1972 | Aagaard | 179/15 AQ |
| 3,649,763 | 3/1972 | Thompson | 179/15 AQ |
| 3,678,205 | 7/1972 | Cohen et al. | 179/15 AQ |
| 3,737,586 | 6/1973 | Johnson | 179/15 AQ |
| 3,740,480 | 6/1973 | Krupp | 19/15 AQ |
| 3,781,485 | 12/1973 | Woodward | 179/18 FG |
| 3,860,761 | 1/1975 | O'Neill | 179/15 A |

Primary Examiner—Kathleen H. Claffy
Assistant Examiner—Joseph A. Popek
Attorney, Agent, or Firm—Cushman, Darby & Cushman

[57] ABSTRACT

A synchronous digital data switching apparatus in the form of a PABX telephone system is disclosed. The extension telephones of the apparatus are fully digital and transmit synchronous digital data to the switch. The switch includes a detector for scanning the inlets and remains connected to each inlet until the state of that inlet or a code is detected. Consequently the size of the switch is limited by the speed of available technology as all inlets must be examined within the minimum signalling period of any inlet. The telephones continually transmit digital data relevant to their state and also transmit digital codes during signalling. The apparatus is processor controlled and a switch memory for setting up connections between any inlet and any one or more outlets is time shared between the switch and processor. The processor receives information from the detector relevant to the condition of an inlet and compares that information with information from the switch memory relevant to the condition of that inlet on the previous scan. Service tones for the apparatus are digital and are inserted at inlets to the switch and on a single highway within the switch during particular connections. A switch memory utilizing abbreviated addressing to save memory is also disclosed.

15 Claims, 3 Drawing Figures

TIME DIVISION MULTIPLEXED DIGITAL SWITCHING APPARATUS

This invention relates to digital switching apparatus and more particularly to improved time division multiplexed (T.D.M.) digital switching apparatus suitable to use in, for example, a digital telephone system.

The main object of the invention is to provide an improved digital switching apparatus suitable for switching any one of a plurality of data inlets to any one of a plurality of data outlets during a particular time slot in a sequence which switching apparatus is less complex and therefore less expensive than any prior art apparatus.

The invention has particular utility in PABX telephone systems wherein the unique features reduce the storage capacity requirements and complexity of the control and associated program necessary to provide the required facilities of a modern PABX my making use of available bit capacity and the fact that the digital phones generate signals continuously and in synchronism with the system clock. Thus it is possible to obviate the need for calling in registers upon detection of a call or during the normal progress of a call prior to making inquiry calls or the like. Unlike present day telephone systems therefore the scanning process and subsequent state analysis and execution of a connection sequence to enable a register to be connected, need not be used. Instead the exchange control listens in sequentially and unconditionally to each telephone instrument in turn in order to determine its full status and to interpret any signal being sent whereby no registers are required and signalling may be undertaken at any time during the progress of a call. Of course the size of the apparatus, that is, the number of inlets, is limited by the speed of the available technology as will become apparent to persons skilled in the art from the description hereinbelow.

In order for an understanding of the invention one particular embodiment will now be described with reference to the accompanying drawings wherein.

Figure 1:
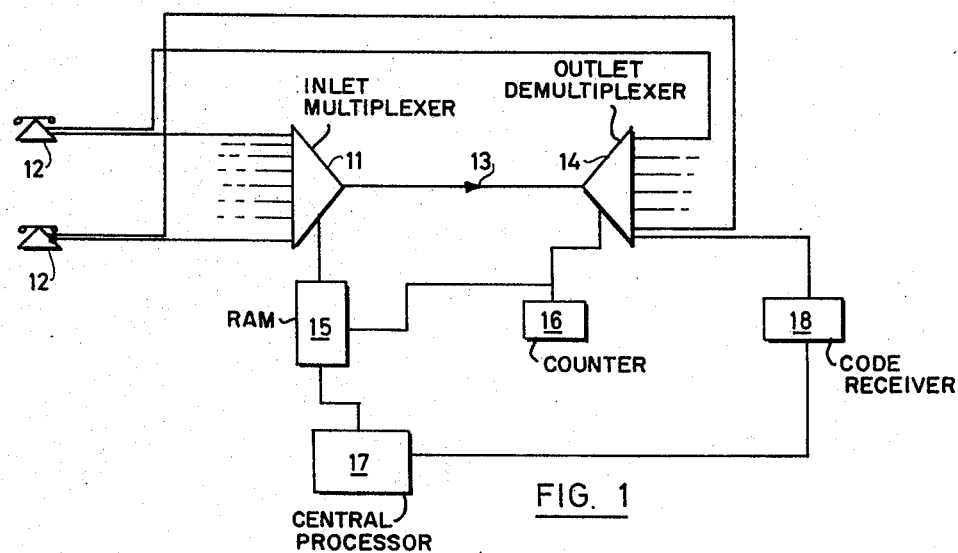
FIG. 1 is a simplified block diagram of the apparatus according to the embodiment.

The embodiment herein described relates to a synchronous digital PABX telephone system where the telephone instruments are not passive but active, synchronous senders constantly sending digital signals to and receiving digital signals from the exchange even when in the idle condition. The telephone instruments thus act as active but decentralised parts of the exchange system. According to a modification of the embodiment the telephones do not send signals relevant to their conition when in the 'on hook' position. This reduces the power consumed by the telephone although the telephones are still 'on'. In other words the telephones can still receive signals from the exchange to switch the telephone 'on' and taking the handset 'off hook' also causes the telephone to again transmit signals relevant to its condition. Throughout the drawings like reference numerals designate like or similar parts.

Referring now to FIG. 1 the apparatus includes a switch comprising an inlet multiplexer 11 and an outlet demultiplexer 14. The inlet multiplexer 11 receives digital data from extension telephones 12 and other digital sources once during each cycle and time multiplexes this data onto a single highway 13. The phones 12 are completely digital, that is, both the voice frequencies and the signals are transmitted from the phone in the form of synchronous digital data.

A switch memory in the form of a random access memory (RAM) 15, and a counter 16, provide the means for setting up a connection through the switch. The counter 16 steps sequentially through the outlet addresses during each cycle and consequently each outlet of the demultiplexer 14 is in turn connected to the highway 13 during a dedicated time slot during each cycle. At the same time the counter 16 sequentially addresses the words of the RAM 15 and if a particular word of the RAM contains an inlet address, that address may be presented to the multiplexer 11 causing the inlet to be switched or connected onto the highway 13 during the particular time slot.

Figure 3:
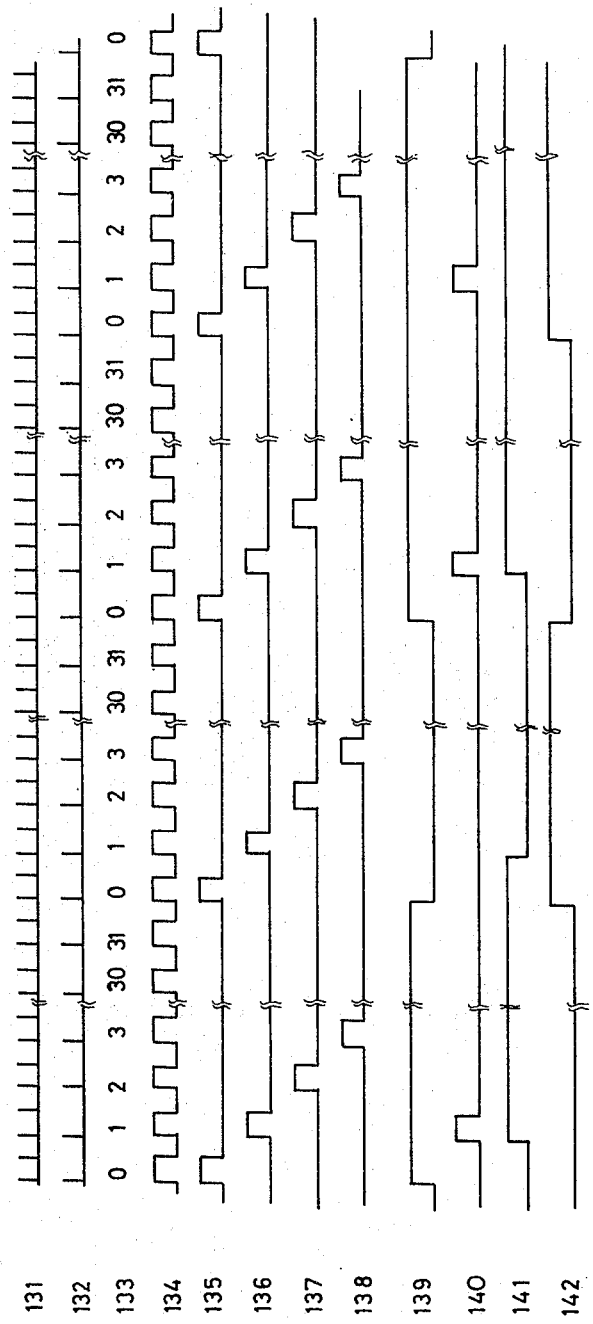
FIG. 3 is a timing diagram for illustrating the timing of various parts of apparatus of the embodiment.

The operation of the switch will now be explained with reference to FIG. 3.

131 refers to the basic system clock. From this pulses are derived, 132 to step the counter 16, which counts from zero to thirty-one shown in 133. For half of each time slot shown in 132 the switch is enabled as shown in 134. At this time the counter output is connected to the switch demultiplexer 14, which connects the highway 13 to the output addressed by the counter 16. At the same time the counter output is fed to the RAM 15 to address a location which contains the inlet number which is to be connected to that output. 135, 136, 137, 138 show the times during which the highway 13 is connected to the outlets 0, 1, 2, 3 respectively, and the time during which the required inlet address from the RAM 15 is fed to the inlet multiplexer to enable the data from that inlet to be connected to the highway 13. 139 shows a typical data waveform of a typical inlet that is clocked into a one bit memory at the switch inlet (not shown), at counter time 0. This data may then be transferred through the switch to any outlet for example outlet 1. 140 shows the typical data output of the switch to channel 1. This must be clocked into a 1 bit memory (not shown) which forms part of the demultiplexer 14, to give an output shown in 141 which is then resynchronised to the system data rate by being clocked into a second 1 bit memory (not shown) at counter time 0 to produce an output waveform shown in 142.

In order to set up a connection through the switch then, it is necessary to write the address of the calling party (A) in the RAM 15 in the location corresponding to the called party (B). Such a connection is only in simplex form and in order to make a duplex connection it is necessary to also write the address of B in the RAM 15 in the location corresponding to A. Thus when the counter 16 steps to the address of the outlet B that address is sent to the demultiplexer 14 causing outlet B to be connected to the highway and at the same time the counter addresses the location of B in the RAM 15 causing the address of A to be sent to the multiplexer 11. Therefore, at the same time as outlet B is connected to the highway 13 inlet A is connected to the highway 13 establishing the required connection. Similarly, when the counter 16 steps to outlet A the RAM 15 sends the address of B to the multiplexer and inlet B is connected to the highway.

The system is controlled by a control or central processor 17 which inspects outputs from a code receiver. The processor 17 receives information from the code receiver 18 in order to continually update the system, for example, by writing new addresses into the RAM 15. The code receiver 18 successively monitors inlets either by being connected directly to the highway 13 or as in this embodiment, being connected to the demultiplexer 14 as shown. The code receiver 18 detects the presence or absence of codes from the inlets. The code receiver 18 is connected to a particular inlet being monitored by the control processor 17 and remains connected to that inlet until it has received enough data bits to decide the state of that particular extension. This is possible provided the code receiver 18 can receive sufficient bits from each inlet and step to all inlets within the minimum signalling period of each extension. Using digital signalling enables determination of the state in a very short time and thus the code receiver 18 can be time shared between all the inlets. Therefore no other code receivers are required and consequently complicated hardware is saved. The code receiver 18 operates on the principle of using each of the data bits arriving in serial form as the least significant bits of the address for a micro-program stored in a read only memory (ROM) which provides the other address bits, thus causing the program to be stepped through a sequence of addresses which depend upon the sequence of the incoming data bits. For a program to end up at a specified address the code receiver 18 must receive the code which is unique in causing the program to arrive at that address. For a description of one suitable form of code receiver, the reader is referred to our copending application entitled "Code Detector" filed concurrently herewith.

On detection and decoding of a code from a particular extension the code receiver 18 stops and signals that state to the processor by two bits which specify the condition of that inlets telephone (on-hook, off-hook or sending a code) and four bits giving the binary representation of the code which was sent. The processor 17 then uses the two bits plus the contents of the extensions location in the RAM 15 to decide if that extension has changed state requiring the processor 17 to initiate a program sequence appropriate to that change of state.

Figure 2:
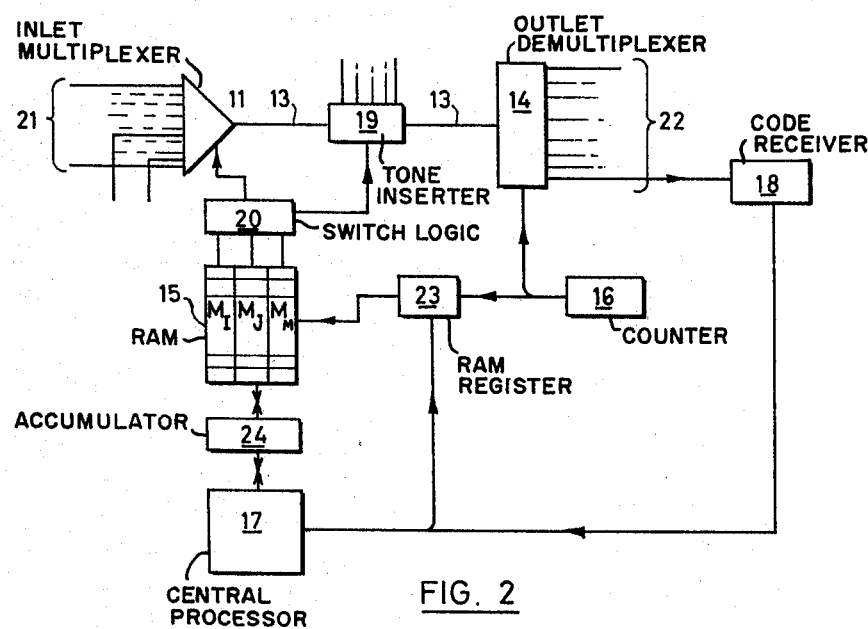
FIG. 2 is a more detailed block diagram of the embodiment according to FIG. 1.

FIG. 2 is a more detailed block diagram of the system of FIG. 1. In FIG. 2 the inlets and outlets are designated generally at 21 and 22, respectively. The inlet multiplexer 11 is a 32 input multiplexer which enables 23 extension inlets, six junction inlets to enable the system to interface with an external telephone system and two inlets for service tones as will be explained hereinbelow.

The remaining inlet is the zero or reset inlet and may be used for a common alarm or other purpose as will be described later. The outlets 22 comprise the 23 extensions, the six junctions, the code receiver 18 and the reset leaving one unused outlet.

The demultiplexer 14 comprises essentially a separate D flip flop for each of the 32 switch outlets. The highway 13 is connected to the D input of all flip flops and a clock pulse is demultiplexed successively to the clock input of each flip flop in turn to provide a strobe pulse to latch the data appearing on the highway 13 into the respective flip flops. The demultiplexer 14 is addressed by the counter 16 which steps sequentially through the outlet addresses. According to this particular embodiment the digital data from the telephones is delta modulated data at 64K bits/sec and therefore data on the highway 13 is clocked at 2.04MHz (32 × 64KHz). The clock and counter 16 address to the demultiplexer is therefore running at 2.048MHz. The telephones have A/D convertors built into the phone and the codes are generated directly as digital bit streams by utilizing a conventional push button matrix generating a sequential digital code.

Some of the tones may be inserted directly onto the highway by a tone inserter 19. The tone inserter 19 is adapted, in use, to insert ring tone, number unobtainable (NU) tone, silent tone, special operators ring and selected extension recall tone when required. Busy tone and dial tone are the two tones inserted at two of the inputs to the multiplexer 11, respectively.

The tones used in the PABX are not generated by conventional means, i.e., analogue generation and digital encoding, but rather all tones are generated by direct digital simulation. In particular the tones are generated by selective combination of sub-frequencies of the 64KHz data rate to form sequenced digital codes, which when decoded by the digital delta decoders will effectively sound like the desired signalling tones. The method provides for any audible frequency tone to be generated, and also any particular modulation of the tone to be incorporated. In addition any combination of tones can be introduced into the signalling. The tones are generated in a tone generator (not shown) and are connected to the tone insertor 19 or the multiplexer 11 as described above.

A feature of this embodiment is the minimizing of the data storage hardware required and the way in which this is done is described below. This reduces the hardware, the number of locations into which data must be written and reduces the gating to transfer data thus reducing the addressing requirements of the control processor.

The RAM 15 is a 32 word RAM and each word of the RAM is divided into three parts $M_I$, $M_J$ and $M_M$ as shown in FIG. 2. $M_I$ comprises 5 bits and provides the address on any one of the 32 inlets to the multiplexer 11. In order to provide an enquiry call facility while holding a junction call it should be apparent that it is necessary to store an additional address. That is, the junction address must be stored and it is also necessary to store the address of the further party during the enquiry call. This would normally require an additional five bit store. However, in accordance with this embodiment the additional information is stored by means of an additional three bit store in the following manner. The six junctions are arranged such that their binary addresses all have two common bits, e.g. 01101, 01110, 01111, 11100, 11101 and 11110. The second and third bits are the same in each address and are added to the bits from $M_J$ externally in the switch logic unit 20. It is therefore only necessary to store three bits in $M_J$ to specify a junction, that is 001, 010, 011, 100, 101, 110.

It should be appreciated that the data from $M_J$ does not specify the inlet address of the junction until the extra two bits are added in the logic unit 20. $M_M$ comprises two bits and is the address modifier. The two bits in $M_M$ "tell" the logic unit 20 that $M_I$ or $M_J$ is to be sent to the switch, and in addition whether $M_I$ is to be "inhibited", or that ring tone is to be sent instead. By arranging the switch memory 15 in this manner and by providing busy tone and dial tone as inlets to the switch with the other tones being inserted directly onto the highway 13, the system is simplified by reducing significantly the size of the switch memory or by avoiding the use of an additional memory to store further information. Consequently the control processor and associated program is simplified since fewer data transfers to fewer places are required.

One bit in the RAM is used as a marker bit $E_M$ for the two digit dialling of this embodiment. Two digit dialling involves saving the first digit in $M_I$ and when the second digit is received the processor 17 makes a partial analysis of the digits and then recombines the bits using a few gates to form an inlet address which conforms to the inlet allocation scheme used in the PABX.

During dialling, the $M_M$ bits of the RAM in the dialling extension slot are in the inhibit condition which causes silent tone to be connected directly onto the highway as described below. The $M_M$ bits of the RAM remain in that condition until a complete number is dialled.

An incoming junction J to the switch is connected to a particular extension A by writing the address of extension A in $M_I$ in the word slot. corresponding to the junction such that when the counter 16 addresses that junction outlet of the demultiplexer 14 the address of extension A is sent to the multiplexer 11. The $M_M$ bits of the particular slot of the RAM 15 "enable" the switch logic unit 20 to send the contents of $M_I$ to the switch. In a similar manner the junction address, in condensed form, is written into $M_J$ of the RAM 15 in the word slot corresponding to extension A such that when the counter 16 addresses extension A outlet at the demultiplexer 14 the junction address from $M_J$ is sent to the multiplexer 11 via the switch logic unit 20 where the two additional address bits are added. The address modifier bits $M_M$ in this slot ensure that $M_J$ is used and not $M_I$.

When extension A initiates an enquiry call it is necessary to connect silent tone to the junction and dial tone to A. In order to do this the address modifier bits in the relevant junction slot of the RAM 15 are altered from a condition which previously meant use $M_I$, to a condition which means inhibit. The switch logic unit 20, on detecting the inhibit condition, connects silent tone directly onto the highway for transmission to the junction during the relevant time slot. In order to send dial tone to extension A the inlet address of dial tone is inserted in the location of extension A in the RAM 15 in the $M_I$ part of the word and the modifier bits of that word are altered to the "use $M_I$" state. When the called extension (extension B) has been dialled ring tone is sent to extension A by changing the $M_M$ bits in the location of extension A of the RAM 15 to the "insert ring tone" condition. The switch logic unit 20 then causes the tone inserter 19 to insert ring tone directly onto the highway. Ring tone is also sent to extension B in the manner described hereinbelow. Also the address of the dial tone inlet is altered to the address of B after the extension has been dialled. Of course the address of extension A is written into the location of extension B of the RAM 15 as in a normal extension to extension call.

On completion of the enquiry, A sends facilities code to the code receiver 18 which causes the processor 17 to restore the RAM 15 to its original junction to extension A state. Busy tone is obtained by inserting the inlet address of busy tone in $M_I$ of the RAM slot of the calling party.

A somewhat cryptic form of addressing is used to insert the remaining tones onto the highway at the tone inserter 19. There are no remaining memory bits in the RAM 15 and therefore this cryptic approach avoids having to use further memory. For instance, in order to insert NU tone the processor 17 writes the address of one of the junction inlets in $M_I$ of the RAM word of the calling extension and inserts the "use $M_I$" state in $M_M$. The swtich logic unit 20 recognizes this impossible condition and causes the tone inserter 19 to insert NU tone on the highway. Similarly, in order to connect ring tone to a called extension, the processor 17 causes the "use $M_J$" condition to be written into $M_M$ of the RAM in the slot of the called extension. With nothing in $M_J$ the switch logic unit 20 recognizes the impossible condition and causes the tone inserter 19 to insert ring tone on the highway 13. With the called extension phone on hook the ring tone is amplified and fed to the handset microphone to produce an audible simulated ring sound. The amplified tone may be sent to the earpiece instead of the microphone but this is undesirable because in the event that a person presses the on hook button whilst holding the earpiece to the ear an incoming call would cause the person to receive the full sound directly in the ear.

Special operators ring tone is a digital code which is substituted in the speech data to the operators phone, effectively mixing or superimposing a tone with the speech to warn the operator that an incoming call is waiting. The tone is inserted onto the highway by the tone inserter 19 but is initiated by a separate hardware block (not shown) under control of the RAM 15. When the operators telephone is on hook the tone is amplified and sent to the handset microphone to produce an audible simulated ring sound.

It will be appreciated that the tones and alarms presented to the switch must be in digital form and thus may be generated from an analogue signal and converted by an analogue to digital convertor or may be generated directly in digital form by suitable counters or shift registers with suitable gating or presetting or suitable ROM's.

A further feature of the present embodiment resides in the fact that the switch memory is time shared between the switch and the control processor as will now be described. It is apparent that the control processor 17 must have some means of periodically "looking" at each inlet to assess any change in condition and initiate the appropriate program. Obviously such means could be provided by extra memory in the processor or elsewhere to store information relevant to the condition of each inlet. However, since the RAM is effectively a call record store it has been found appropriate to allow the processor 17 to time share the RAM 15 and for this purpose the system provides a RAM address register 23 and an accumulator 24. The RAM address register 23 stores the address of the word slot to the "looked" at by the processor 17. The register 23 is therefore clocked at twice the frequency of the highway 13, that is, 4.096 MHz. Also the register 23 stores the address from the counter 16 for presentation to the RAM 15. Therefore during one clock period of the highway 13 the RAM receives an address from the counter for one half of the period and an address from the processor 17 for the other half. Since the processor 17 operates at a much slower speed than the highway 13 it is necessary to read the information from the RAM 15 into the accumulator 24 to be stored for use by the processor. The information in the accumulator 24 may then be used, when convenient, by the processor 17.

A further feature of the embodiment involves the decoding of the information from the accumulator 24 for use by the processor 17. This decoding is greatly simplified because of the organization of the RAM 15 which not only minimizes the total number of bits but also the hardware required to decode the data in the RAM 15. This greatly reduces the amount of software necessary. A simple and unique method of hardware decoding of the information in the accumulator 24 provides an eight bit address for determining an entry point into the program of the processor 17 instead of the 11 bit address in the accumulator 24. Since it is only necessary for the processor to know that type of connection is presently in the RAM and not the particular extension or other inlets actual number, only two bits are required from $M_i$. Also since it is only necessary to know whether or not a junction is involved only one bit is required from $M_j$. The other five bits of the eight bits to the processor 17 comprise the two $M_M$ bits, the $E_M$ bit and two bits from the code receiver 18 which specify the condition of the particular inlet being scanned (three conditions) or indicate that the code receiver 18 is still scanning. A simple arrangement of gates achieves this hardware decoding. More specifically, the two bits from $M_i$ specify that the inlet in question is one of the following: Busy tone, dial tone, reset or any extension. The one bit from $M_j$ specifies junction or no junction and the other three bits perform their normal function. The eight bit address is collected in a Program Address Store (not shown) to provide an entry point word for the processor program. This unique eight bit word from the accumulator 24 specifies anyone of 60 possible points of entry into a software program of the processor 17 and this reduces the amount of software decoding within the processor 17. The 60 points of entry arise because there are 20 possible telephony call stages (sending code, pause between codes, facilities code connection being established, etc.) in this embodiment and the telephone can be in three states (off-hook, on-hook or signalling).

The functional operation of the program of the processor 17 is a simple loop. At the starting point of the loop the program increments an internal counter (not shown) of the processor 17 so that it steps to the next sequential inlet address. It then connects the inlet corresponding to that number to the code receiver by establishing a connection through the switch. The processor 17 then pauses and enables the code receiver 18 to analyse the data bits arriving from the inlet.

When the code receiver 18 has signalled to the processor 17 that it has finished analyzing the data from that inlet the processor 17 reads the contents of the inlet RAM location into the accumulator 14 as described above and then uses the output of the program address store as the starting address in the program. At each of the possible starting addresses or entry point words there is a small program routine appropriate to the call stage which caused that entry point to be used. After executing this small routine the program then goes back to the start point and repeats the above process for the next inlet in turn.

The unique decoding system described above enables the system to utilize a much smaller control processor 17 and associated software program than would normally be required. In fact the processor 17 becomes simplified to the extent of comprising essentially a Read only Memory (ROM) and has no other memory capabilities and no arithmetric capabilities. The processor 17 could possibly be best described as a micro program processor or sequencer.

Since it is necessary for the incoming information to the system to be in digital form it is necessary to provide some means (not shown) for converting analogue speech information from outside to digital data, assuming of course the system is to be interfaced with a conventional outside analogue system. Such means must also be capable of converting digital codes generated in the system to decadic impulses for transmission to the outside system in the case of junction calls.

The means used in the present embodiment comprises six two way junction interface units operated by a single common control processor (not shown). The common control processor contains a memory in the form of a first in first out memory (FIFO). The central processor 17 sends a signal to the control processor requesting that some signal be sent by a selected interface unit. The control processor stores this signaling the FIFO and the central processor 17 continues with its own program. The control processor then causes the selected interface unit to send the required signal to the external system. The control processor can accept many requests from the central processor 17 while sending signals via some or all of the interface units. If more than one request refers to a given interface unit then the requests are satisfied in the order in which they are made. If request refer to different interface units then the requests are satisfied by the interface units simultaneously.

In the normal operation of the common control processor the information stored by the FIFO is continually circulated, that is, words appearing at its output are copies back to the input after an operation is performed on the particular relay set.

One suitable control processor for the purpose is described in our co-pending patent application entitled "Digital Control Processor" and filed concurrently with the present application.

This common control processor can also search for a relay set which is idle, has a new call or has a call which has timed out.

It should be appreciated from the embodiment described above that the present invention provides a unique switching apparatus which may be readily adapted for a number of different and varying applications and which is relatively simple in construction. Also since there is a dedicated location in the switch outlets the system is congestionless, i.e., there is always a path to set up a connection through the switch unless of course the called extension is busy.

Of course the invention is not limited to the particular embodiment described by way of example hereinabove as many variations may be readily effected by persons skilled in the art. For example, the invention is not limited to digital telephone systems and could be applied to switch any other forms of digital data. Also, the invention could be adapted for use in analogue systems by providing analogue to digital converters at the switch, that is, in the above described embodiment the phones could be conventional analogue phones and the A/D conversion could be done adjacent to the switch. However, this modification complicates the system to a certain extent because the signalling from analogue telephones is much slower than from the digital phones utilized in the above described embodiment and therefore the code receiver 18 requires more time to analyze signalling information from the phones. This complicates the control processor 17 and associated program.

According to a further modification the counter 16 may be replaced with a shift register. Also, whilst the system of the above embodiment is a synchronous system it is conceivable that the invention could be applied to a non-synchronous system.

The apparatus may be utilized to switch any form of digital data presented at the inlets for example, pulse code modulated digital data. Of course the size of the apparatus insofar as the number of inlets and outlets is concerned may also be varied.

A further embodiment provides a PABX having 10 extensions and three junction lines which may be readily converted to the 23 extension embodiment described above by adding a printed circuit card and changing some of the straps on the existing cards.

The essential differences in changing from 10 to 23 lines being that in the switch memory (RAM) $M_I$ goes from four to five bits and also the control program uses one digit dialling instead of the two digit dialling of the 23 extension line embodiment described above.

A further facility which may be incorporated into any of the PABX embodiments is a reference table which may be used by the control processor to give information about each inlet and could be addressed from the RAM address register. In a particular case it could be connected so as to give categories for each inlet. The processor 17 could be programmed to examine this table and may find that a particular inlet is for example barred from dialling on an external line.

We claim:

1. A synchronous digital data switching apparatus including a congestionless digital switch having a plurality of digital data inlets and a plurality of digital data outlets connected thereto, said switch being adapted to transfer digital data from any inlet to any one or more outlets using time division multiplexing, an active digital data terminal connected to each inlet and adapted to send synchronous digital data to each inlet respectively, said terminals also being adapted to continuously transmit digital data relevant to their state at any particular time, time division multiplexed detecting means for cyclicly scanning said inlets to receive, from each terminal in turn, said data relevant to the state of the terminal, and control means for receiving information from said detecting means when the condition of a terminal has been determined and controlling operation of said apparatus in response thereto, said detecting means scanning all said inlets within the minimum time in which said terminals can remain in any one state.

2. An apparatus as defined in claim 1 wherein said switch is adapted to inhibit data being transferred from an inlet to one or more outlets during a connection between said inlet and said one or more outlets and insert other digital data in place thereof while retaining information to enable said connection to be restored.

3. An apparatus as defined in claim 2 which forms a voice communications system, said other digital data being digital tones which are fed to the outlet in question at desired times during a connection.

4. An apparatus as defined in claim 1 wherein said switch is non-blocking and said detecting means is connected to an outlet of the switch, said switch comprising a multiplexer for time multiplexing digital data appearing on said inlets onto a single data highway and means to demultiplex data on said highway to respective said outlets.

5. A synchronous digital data switching apparatus including a congestionless digital switch having a plurality of digital data inlets and a plurality of digital data outlets connected thereto, said switch being adapted to transfer digital data from any inlet to any one or more outlets using time division multiplexing, said switch being non-blocking and said switch comprising a multiplexer for time multiplexing digital data appearing on said inlets onto a single data highway, and means to demultiplex data on said highway to respective ones of said outlets, an active digital data terminal connected to each inlet and adapted to send synchronous digital data to each inlet respectively, said terminals also being adapted to continuously transmit digital data relevant to their state at any particular time, time division multiplexed detecting means for cyclicly scanning said inlets to receive, from each terminal in turn, said data relevant to the state of the terminal, wherein said detecting means is connected to an outlet of the switch, and control means for receiving information from said detecting means when the condition of a terminal has been determined and controlling operation of said apparatus in response thereto, said detecting means scanning all said inlets within the minimum time in which said terminals can remain in any one state.

6. An apparatus as defined in claim 5 wherein said control means is a processor which receives said information from said detecting means relating to the condition of the particular inlet being monitored and compares said information with information relating to the condition of the particular inlet on the previous scan to initiate a program appropriate to any change in condition of the said inlet.

7. An apparatus as defined in claim 6 wherein said switch memory is a RAM (random access memory) which is time shared between said switch and said processor, said RAM providing said processor with said information relating to the condition of the particular inlet on the previous scan.

8. An apparatus as defined in claim 7 wherein information to said processor from said detecting means and from said memory is logic information which is decoded by a combination of hardware and software decoding to reduce program volume, wherein information to said processor from said detecting means is logic information which is partly decoded by hardware within said detecting means and information to said processor from said memory is logic information which is partly decoded by hardware, said logic information from said detecting means and memory being combined to provide an entry point word for a software program of said processor.

9. An apparatus as defined in claim 8 which forms a voice communications system wherein said data terminals comprise extension devices adapted to receive voice frequency signals and convert said signals into a digital bit stream, each data terminal being connected to one said inlet and one said outlet, one or more of said inlets and outlets being connected to junction lines enabling said system to transfer data to, and receive data from an external system, and one or more of said inlets being connected to service tones for the system.

10. An apparatus as defined in claim 9 wherein each location of the RAM is arranged to contain the digital inlet address of an extension of the system, the digital inlet address of a junction line in abbreviated form and some address modifier bits to determine whether said extension or said junction line address is transmitted to the switch or whether a service tone is connected to the highway, said arrangement enabling inquiry calls to be made without further address memoroy storage.

11. An apparatus as defined in claim 10 wherein said junction line inlets are arranged to have digital addresses with one or more common bits in order to enable abbreviation of the junction line addresses in the RAM.

12. An apparatus as defined in claim 11 wherein states within said switch memory not used for switching operations are used for storage of control data.

13. An apparatus as defined in claim 9 wherein data on said highway may be inhibited and any one of several digital service tones may be inserted onto the highway in place of the data, said RAM storing said inlet address while said data is inhibited to enable data to be transferred between the respective inlet and outlet at some particular time after said service tone has been inserted.

14. An apparatus as defined in claim 9 wherein said voice communications system is a PABX telephone system and said extension device are telephones.

15. A synchronous digital data switching apparatus in a voice communication system comprising a congestionless digital switch having a plurality of digital data inlets and a plurality of digital data outlets connected thereto, said switch being adapted to transfer digital data from any inlet to any one or more outlets using time division multiplexing, an active digital data terminal connected to each inlet and adapted to send synchronous digital data to each inlet respectively, said terminals also being adapted to continuously transmit digital data relevant to their state at any particular time wherein each data terminal is connected to an inlet and an outlet of said switch and all idle terminals are connected through said switch to a particular inlet, which particular inlet is adapted to provide, in digital form, a night switch alarm, burglar alarm, fire alarm or other desirable alarm, time division multiplexed detecting means for cyclicly scanning said inlets to receive, from each terminal in turn, said data relevant to the state of the terminal, and control means for receiving information from said detecting means when the condition of a terminal has been determined and controlling operation of said apparatus in response thereto, said detecting means scanning all said inlets within the minimum time in which said terminals can remain in any one state.

* * * * *